(12) United States Patent
Templier et al.

(10) Patent No.: US 7,166,894 B2
(45) Date of Patent: Jan. 23, 2007

(54) SCHOTTKY POWER DIODE WITH SICOI SUBSTRATE AND PROCESS FOR MAKING SUCH DIODE

(75) Inventors: François Templier, Voiron (FR);
Thierry Billon, Coublevie (FR);
Nicolas Daval, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/507,757

(22) PCT Filed: Mar. 12, 2003

(86) PCT No.: PCT/FR03/00787

§ 371 (c)(1),
(2), (4) Date: Sep. 14, 2004

(87) PCT Pub. No.: WO03/077321

PCT Pub. Date: Sep. 18, 2003

(65) Prior Publication Data

US 2005/0161760 A1    Jul. 28, 2005

(30) Foreign Application Priority Data

Mar. 14, 2002    (FR) .................................. 02 03165

(51) Int. Cl.
*H01L 27/01*    (2006.01)
*H01L 27/12*    (2006.01)
*H01L 31/0392*    (2006.01)
*H01L 29/80*    (2006.01)
*H01L 31/112*    (2006.01)

(52) U.S. Cl. ...................... 257/347; 257/287; 257/348; 257/349; 257/350; 257/351; 257/352; 257/353; 257/354; 257/507; 257/618; 257/623; 438/149; 438/167; 438/311; 438/578; 438/931

(58) Field of Classification Search ........ 257/347–354, 257/507, 287, 618, 623; 438/149, 167, 311, 438/578, 931

See application file for complete search history.

(56) References Cited

U.S. PATENT DOCUMENTS

| 4,045,248 | A | * | 8/1977 | Shannon et al. ............ 438/523 |
| 4,680,601 | A | * | 7/1987 | Mitlehner et al. ............ 257/73 |
| 4,888,304 | A |   | 12/1989 | Nakagawa et al. |
| 4,983,538 | A | * | 1/1991 | Gotou ........................ 438/459 |
| 5,880,491 | A | * | 3/1999 | Soref et al. ................. 257/190 |
| 5,898,210 | A | * | 4/1999 | Han et al. ................... 257/471 |
| 6,391,799 | B1 |   | 5/2002 | Di Cioccio |
| 6,501,145 | B1 |   | 12/2002 | Kaminski et al. |

(Continued)

FOREIGN PATENT DOCUMENTS

FR    1 111 688    6/2001

(Continued)

*Primary Examiner*—Ida M. Soward
(74) *Attorney, Agent, or Firm*—Thelen Reid Brown Raysman & Steiner LLP (57) ABSTRACT

The present invention relates to a power junction device including a substrate of the SiCOI type with a layer of silicon carbide (16) insulated from a solid carrier (12) by a buried layer of insulant (14), and including at least one Schottky contact between a first metal layer (40) and the surface layer of silicon carbide (16), the first metal layer (30) constituting an anode.

14 Claims, 6 Drawing Sheets

U.S. PATENT DOCUMENTS

| | | |
|---|---|---|
| 6,509,613 B1 * | 1/2003 | En et al. .................. 257/349 |
| 6,566,158 B2 * | 5/2003 | Eriksen et al. ............ 438/53 |
| 6,566,680 B1 * | 5/2003 | Krivokapic ............... 257/30 |
| 6,573,534 B1 * | 6/2003 | Kumar et al. .............. 257/77 |
| 6,576,973 B2 | 6/2003 | Collard et al. |
| 6,689,669 B2 * | 2/2004 | Kurtz et al. ............... 438/459 |
| 6,784,489 B1 * | 8/2004 | Menegoli ................. 257/343 |
| 6,903,373 B1 * | 6/2005 | Lotfi et al. ................ 257/77 |
| 2002/0187622 A1 | 12/2002 | Bartsch et al. |
| 2003/0119249 A1 * | 6/2003 | Swanson et al. .......... 438/234 |
| 2005/0260821 A1 * | 11/2005 | Van Zeghbroeck et al. . 438/343 |

FOREIGN PATENT DOCUMENTS

| | | |
|---|---|---|
| JP | 01023569 | 1/1989 |
| JP | 11074498 | 3/1999 |
| WO | WO 9727629 | 7/1997 |
| WO | WO 98/56043 | 12/1998 |
| WO | WO 99/39371 | 8/1999 |
| WO | WO 01/37328 | 5/2001 |

* cited by examiner

SCHOTTKY POWER DIODE WITH SICOI SUBSTRATE AND PROCESS FOR MAKING SUCH DIODE

CROSS-REFERENCE TO RELATED APPLICATION

This application claims priority based on International Patent Application No. PCT/FR03/00787, entitled "Schottky Power Diode Comprising a SICOI Substrate and the Method of Producing One Such Substrate" by Francois Templier, Thierry Billon and Nicolas Daval, which claims priority of French Application No. 02 03165, filed on Mar. 14, 2002, and which was not published in English.

TECHNICAL FIELD

The present invention relates to a power junction device and a process for making such a device.

By power junction is understood a junction susceptible of being passed through by a high current of the order of one ampere or several amperes, and susceptible of being subjected to an inverse voltage of several hundred volts. The invention is aimed more particularly at making diodes that are susceptible of operation at a voltage in a range from 200 to 1500 volts.

The invention finds applications in the fields of power electronics and particularly in integrated power electronics.

PRIOR ART

At the present time, a number of power electronics devices operating in a voltage range from 200 to 1500 volts use bipolar silicon diodes. Yet a major drawback of silicon diodes is that they present substantial switching losses. These losses are due to the operational physics of these bipolar diodes which is based on the use of minority carriers.

In similar applications, silicon carbide (SiC) allows Schottky type diodes to be made. These diodes have static performances comparable to those manufactured from silicon. Moreover, silicon carbide based Schottky diodes do not suffer from switching losses. This advantage stems from the absence of minority carriers. Thus we find silicon carbide diodes with operating voltages of the order of 300 to 1500 volts.

The use of silicon carbide and the development of diodes based on this material are however still held back by the excessive cost of the silicon carbide. It is estimated that the cost of a silicon carbide substrate may represent up to half the cost of a component made on this substrate.

Furthermore, silicon carbide substrates are usually only available in the form of wafers with a limited diameter. The diameter is generally 2 or 3 inches (about 5.1 or 7.6 cm). The small diameter of silicon carbide substrates makes them incompatible with the equipment and production lines specific to silicon technology. Silicon wafers are indeed available with larger diameters. Thus, the need to resort to special equipment further increases the price of silicon carbide-based components.

As far as system integration is concerned, the prior art is further illustrated by documents (1) and (2). These illustrate the manufacture of switching systems on substrates that are of the SOI type but which do not meet the integration and power criteria accepted for the applications targeted by the invention.

DISCLOSURE OF THE INVENTION

One purpose of the invention is to propose a power junction device, and a process for manufacturing it, which do not present the limitations mentioned above in relation to the description of the prior art.

A particular purpose is to propose a device of this kind that is susceptible of manufacture on conventional production lines adapted to silicon substrate processing.

Yet another purpose is to propose a device and process that are inexpensive.

A final purpose is to propose a reliable device capable of operating with inverse withstand voltages in a range from 200 to 1500 volts and a forward current of 1 to 10 A.

To fulfil these purposes, the invention relates more precisely to a power junction device that includes a SiCOI substrate with a layer of silicon carbide insulated from a solid support by a buried layer of insulant, and including at least one Schottky contact between a first metal layer and the silicon carbide surface layer, the first metal layer constituting an anode.

In terms of the invention, by power junction device is understood a device which comprises a junction susceptible of being used as a power diode. The device is not however restricted necessarily to a diode. It may also comprise one or more switches and possibly associated control means integrated on the same substrate.

By means of the invention and particularly by using a SiCOI substrate the cost of manufacturing a power junction device may be substantially reduced. One reason for this is that the SiCOI substrate is less expensive than a solid silicon carbide substrate. Moreover, SiCOI substrates are available with diameters that are compatible with the tools specific to silicon wafer processing.

According to one particular aspect of the invention, the device may be configured in such a way that the metal layer forming the Schottky junction is in contact with one flank of the layer of silicon carbide, the flank forming an external angle relative to a main surface of this layer.

The angle formed by the flank of the layer of silicon carbide allows the contact between the first metal layer and the semiconductor SiC layer to be optimised. This angle also has an influence over the inverse withstand voltage. Furthermore, electrical conduction in the layer of silicon carbide, parallel to this layer, makes it possible to reduce considerably the risk of weaknesses due to crystalline defects. These weaknesses such as micro-cavities in fact mainly affect conduction transverse to the layers.

In a particular embodiment, the angle, measured relative to a main surface of the layer of silicon carbide, in contact with the buried layer of insulant, may have a value between 20° and 80°, preferably close to 45°.

According to another particular aspect of the invention, the device may comprise a surface layer of insulant coating the layer of silicon carbide. In this case, the first metal layer, forming an anode, extends at least partly over one flank of the surface layer of insulant adjoining the flank of the layer of silicon carbide. The insulating layer, in adjoining the flank of the layer of silicon carbide, may to advantage be turned to good account in order to constitute protection by field reduction around the Schottky contact. It can to this end also have a slope adjusted so as to adjoin the slope formed by the flank of the layer of silicon carbide, or identical to it.

This characteristic allows the withstand voltage of the device to be increased.

As mentioned above, the device can comprise a plurality of diodes or a combination of diodes and other components.

In particular, the device may comprise at least one power diode and at least one transistor, the transistor having a channel formed in the layer of silicon carbide.

According to one particularity of the device, the anode forming metal layer, in other words the metal layer in Schottky contact with the layer of silicon carbide may extend as far as a solid part of the substrate, in silicon. The solid part of the substrate may thus be used to provide a "rear" contact point for the anode. Indeed, one surface of the substrate, opposite the surface carrying the layer of silicon carbide, may be metallized in order to form an anode contact point and so make it easier to package the device.

Connecting the junction anode to the substrate additionally allows its inverse withstand voltage to be increased.

According to one particularity of the invention, the device may have a first anode metal layer and additionally a second cathode metal layer, in ohmic contact with the layer of silicon carbide. The first and second metal layers may have comb-forming parts respectively, the comb-forming parts of the first and second metal layers being interdigitated.

The configuration of a part of the metal layers in the form of interdigitated combs allows higher strength forward currents to be obtained.

The invention also relates to a process for manufacturing a junction device on a SiCOI substrate as described. The process includes the following steps:

a) the formation of an ohmic contact point on one surface of the layer of silicon carbide, opposite the buried layer of insulant, b) localised etching of the layer of silicon carbide outside an area including the ohmic contact so as to release at least one lateral flank on the layer of silicon carbide, and c) the formation of a Schottky contact on the lateral flank.

The order of steps a) and b) may possibly be reversed.

The localised etching carried out at step b) of the process is preferably an etching that uses a lithographic mask and a lithographic agent with restricted selectivity relative to the lithographic mask, so as to give the lateral flank a slope.

Other characteristics and advantages of the invention will emerge from the following description, with reference to the appended drawings in the figures. This description is given purely by way of illustration and non-restrictively.

DETAILED DESCRIPTION OF MODES OF IMPLEMENTATION OF THE INVENTION

In the following description, identical, similar or equivalent parts of the different figures are identified by the same reference signs to make it easier to cross-refer between the figures. Furthermore, and in the interests of clarifying the diagrams, all elements are not shown to a uniform scale. Finally, the description indicates a certain number of values in figures or of parameters. These values or parameters are not indispensable to the implementation of the invention but simply indicate conditions that are particularly favourable for its implementation.

Figure 1:
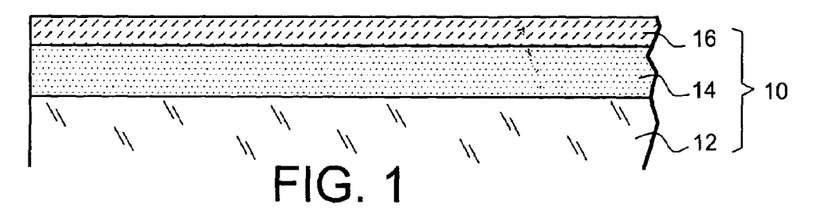
FIG. 1 is a partial diagrammatic cross-section of a SiCOI substrate that can be used to make a device in accordance with the invention.

FIG. 1 shows a SiCOI (silicon carbide on insulant) substrate 10. Such a substrate may be made in particular by implementing a known cleaving technique with the designation "Smart Cut". It includes, in the example shown, a thick layer 12 of silicon constituting a mechanical carrier. This layer is coated in order by a buried insulating layer 14 of silicon oxide and by a surface layer 16 of single-crystal silicon carbide. The silicon may be replaced by another material, as can the insulating layer. The latter can be $Si_3N_4$ for example.

In the particular example described here, the layer 12 of silicon has a thickness between 100 and 500 µm and is doped with N type impurities. The doping is selected to be sufficient to allow current to pass, particularly when it is planned to use the substrate as a rear contact point. This aspect is further described below.

The function of the buried insulating layer 14 of silicon oxide is one of electrical insulation between the different active parts of the device. Its thickness is adjusted as a function of the inverse withstand voltage requirements. Its thickness is, for example between 1 µm and 5 µm, given that a thickness of 1 µm makes it possible to withstand a voltage of about 200 volts.

The surface layer of single-crystal SiC is between 0.1 and 3 µm thick. It is doped P-type or N-type with a concentration of impurities of the order of $10^{15}$ to $5.10^{17}$ cm$^{-3}$.

Figure 2:
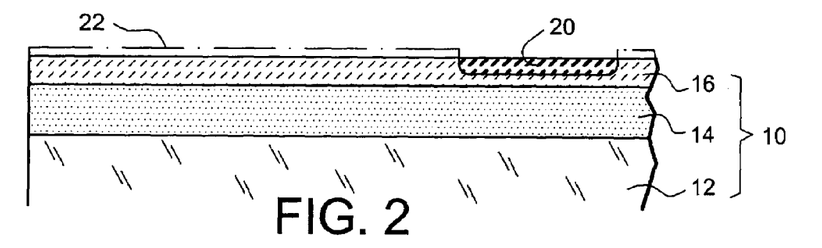
FIGS. 2, 3 and 4 are partial diagrammatic cross-sections of the substrate in FIG. 1, showing stages in the manufacture of a cathode in a device in accordance with the invention.

A first stage in the manufacture of an ohmic contact is shown in FIG. 2. It includes the formation of a doped zone 20 in the layer of silicon carbide. The doped zone is of the same type of conductivity as the layer 16 of silicon carbide but has a stronger concentration of impurities. A nitrogen implantation, for example, is used, leading to an N+ type doping, and allowing a good ohmic contact to be formed with a subsequently deposited metal. The lateral extension of the doped zone is fixed by a silicon oxide implantation mask 22, shaped according to the usual techniques of photolithography. The extension in depth of the doped zone is of the order of 100 to 200 nm. It is fixed by the implantation energy.

After an implantation anneal, intended to activate the doping species, the implantation mask 22 is removed.

A following stage, shown in FIG. 2 includes the deposition on the surface of the layer 16 of silicon carbide of a layer 24 of insulant in a dielectric material such as silicon oxide or nitride. The deposition of this layer preferentially takes place at high temperature so as to give it good dielectric quality. It may, for example, be a 3 µm thick layer of silicon oxide obtained by chemical vapour deposition (CVD).

Figure 3:
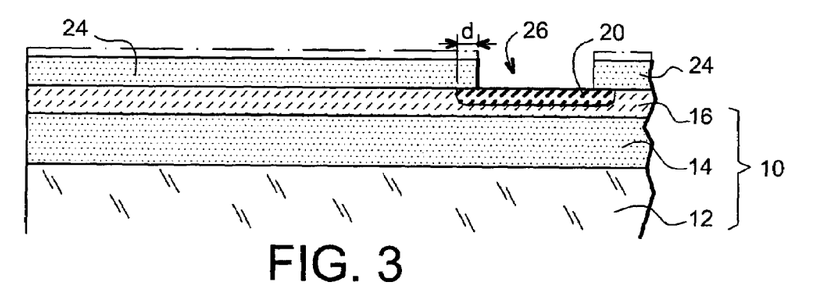

The layer 24 of insulant is shaped by etching so as to provide an opening 26 therein, and to expose a part of the doped zone 20 of the layer 16 of silicon carbide. The lithographic agent is preferentially a fluorinated plasma of $CH_3$ or $SF_5$ so as to control with precision the dimensions of the opening. Furthermore these are set by a mask, shown in outline by a dot and dash line.

It may be seen in the figure that the opening 26 has an area below that of the doped zone 20 and coincides with a central part of this zone. This allows a marginal part of the doped zone 20 to be provided, coated by the layer 24 of insulant. The marginal part, with its extension denoted d, sets a distance between a metal layer of a cathode terminal, described below, and the edge of the doped zone 20. This measure makes it possible to reduce a cathode electric field and thus to increase the withstand voltage of the device.

Figure 4:
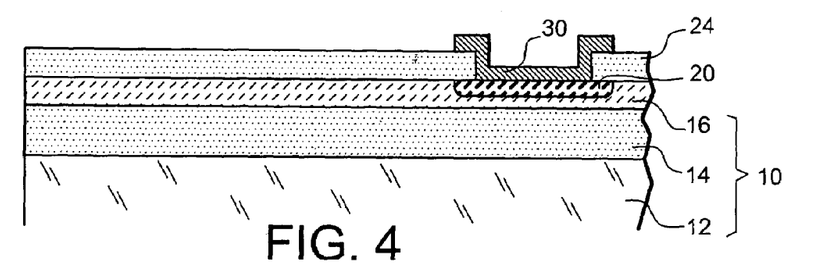

The formation of the cathode terminal is shown in FIG. 4. A metal, contact layer 30, such as W, Ni, Ti, is deposited on the substrate in such a way as to come into contact with the doped zone 20 and to form therewith an ohmic contact. In the example described, a layer of tungsten of a thickness of 50 to 500 nm is deposited by cathode sputtering. It is then etched by wet process or plasma, in accordance with a mask, not shown, in such a way as to set the shape of the cathode terminal. Heat treatment, at a temperature of the order of 900 to 1300° C. depending on the materials, is applied for two minutes so as to anneal the ohmic contact. This operation is performed after the removal of the mask.

The following description relates to the formation of an anode terminal. A first stage in this operation, shown in FIG. 5, includes etching on the layer 24 of insulant so as to expose a new part of the layer 16 of silicon carbide. During this etching, a part of the layer 24 of insulant remains protected by a mask shown in a broken line. The etching parameters, and in particular the etching selectivity, are preferably adjusted so as to give the layer 24 of insulant an etching flank 34 which has a slope at an angle $\alpha$ of 20° to 80° relative to the plane of a main surface of the layer.

Figure 5:
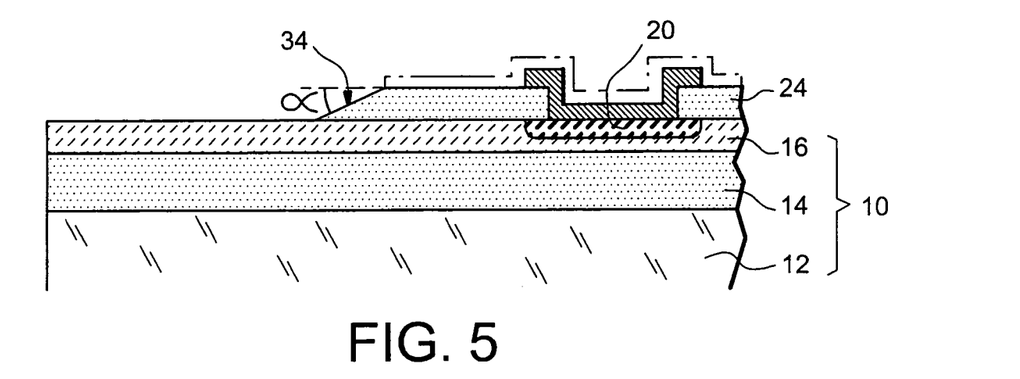
FIGS. 5 to 7 are partial diagrammatic cross-sections of the device in FIG. 4, showing stages in the manufacture of an anode in a device in accordance with the invention.

The lithographic mask is then removed.

Figure 6:
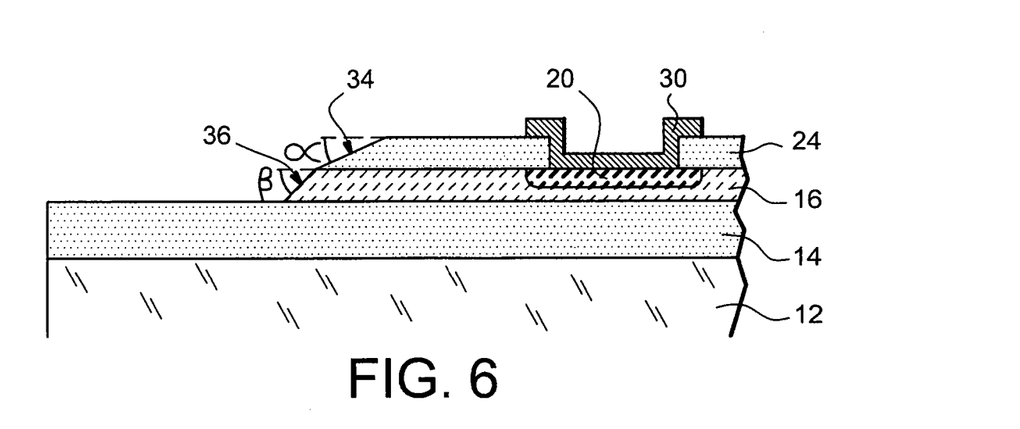

After etching the layer 24 of insulant, the underlying layer 16 of silicon carbide may also be subject to etching. This etching, shown in FIG. 6, is applied by using the residue of the layer 24 of insulant as a lithographic mask.

The etching parameters are again adjusted so as to control the selectivity relative to the layer 24 of insulant and thus to release a lateral flank 36 of the layer 16 of silicon carbide which also forms an angle relative to the main surfaces. This angle, denoted $\beta$, preferably has a value between 20° and 80°, for example 45°. Etching is carried out using a fluorinated plasma, such as $SF_6$ to which more or less oxygen is added to modify the selectivity relative to the layer 24 of insulant. More or less pronounced selectivity allows a steeper or less steep slope to be formed on the lateral flank 36. Etching is applied with barrier on the buried insulating layer 14. It is considered, in the interests of simplification, that the angle $\alpha$ is not modified during this etching.

The slopes $\alpha$ and $\beta$ given to the lateral flanks 34 and 36, respectively, of the layer 24 of insulant and the layer 16 of silicon carbide, make it possible to facilitate the formation of a metal Schottky junction on the layer 16 of silicon carbide. They also dictate the space requirement and the electrical characteristics of the device.

A gentler slope, in other words a smaller angle, allows an increase in the surface of a junction formed on the layer 16 of silicon carbide and, consequently, in the withstand voltage of the junction. A gentle slope does however increase the space requirement of the component on the surface of the substrate. Conversely, a steeper slope allows space to be saved, but at the cost of a technical difficulty.

Figure 7:
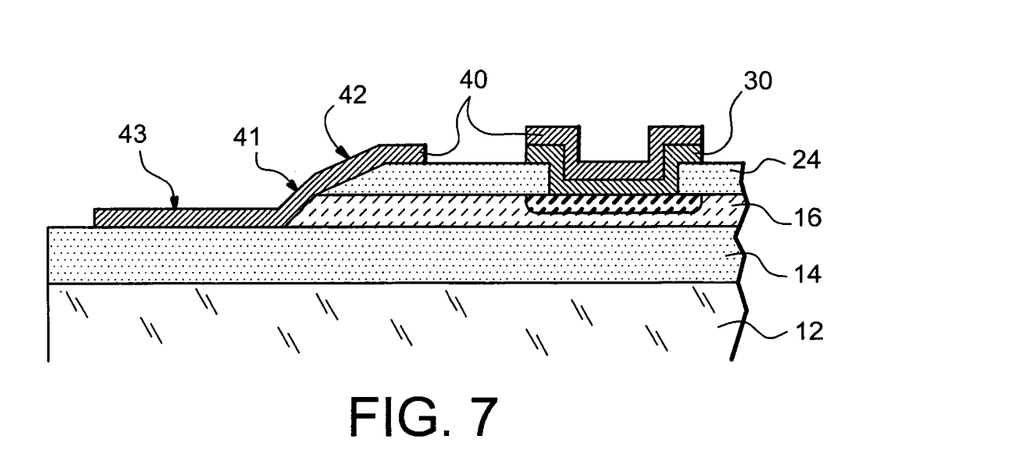

FIG. 7 shows the formation of the Schottky junction. A junction layer 40, including a metal layer, preferably titanium or nickel, is deposited on the substrate so as to coat particularly the lateral flank 36 of the layer 16 of silicon carbide. The metal layer, of a thickness of the order of 50 to 300 nm, is deposited by sputtering or by evaporation over the whole of the exposed surface, then shaped by etching in accordance with a mask that is not shown.

The junction layer 40 may be formed of several sub-layers. In a particular example, it may comprise in order a Ti metal layer, an intermediate layer of TiN and a surface layer of Al. These layers are not detailed in the figures for reasons of clarity.

The titanium metal layer forms the junction itself with the layer 16 of silicon carbide. The function of the aluminium layer is to lower the resistance of the metallization and therefore to increase the admissible in-series current density. Aluminium further makes it easier to weld external connecting wires, also in aluminium, when the device is put into a housing. The layers indicated above can also, as is shown in FIG. 7, coat the metal contact layer 30 forming the cathode terminal. Although in the figure the junction layer 40 exactly coats the ohmic contact of metal contact layer 30, it can also overflow around the cathode terminal or more simply not coat the metal contact layer 30.

The junction layer 40 has several parts which have different functions. A first part 41 is in contact with the layer 16 of silicon carbide. As shown above, this part performs the Schottky junction function.

A second part 42 partially coats the surface of the layer 24 of insulant, and particularly the lateral surface 34 of this layer. It has a field plate function. In other words its purpose is to move a strong electric field critical zone from the edge of the Schottky junction to a thicker part of the surface of the layer 24 of insulant. It will be recalled that the layer 16 of silicon carbide is etched by using the residue of the layer 24 of insulant as a lithographic mask. The lateral surfaces of these layers are therefore self-aligned.

A third part of the junction layer 40, identified by the reference 43, rests on a part of the buried insulating layer 14, exposed during etching of the layer 16 of silicon carbide. It will also be recalled that this buried layer is used as an etching barrier layer. The third part 43 is turned to good account to connect the component to the outside.

When the angles $\alpha$ and $\beta$ formed by the lateral flanks 34, 36 of the layer 16 of silicon carbide and the layer 24 of insulant, respectively, are not too steep, a homogeneous coating by the junction layer 40 can be obtained.

Figure 8:
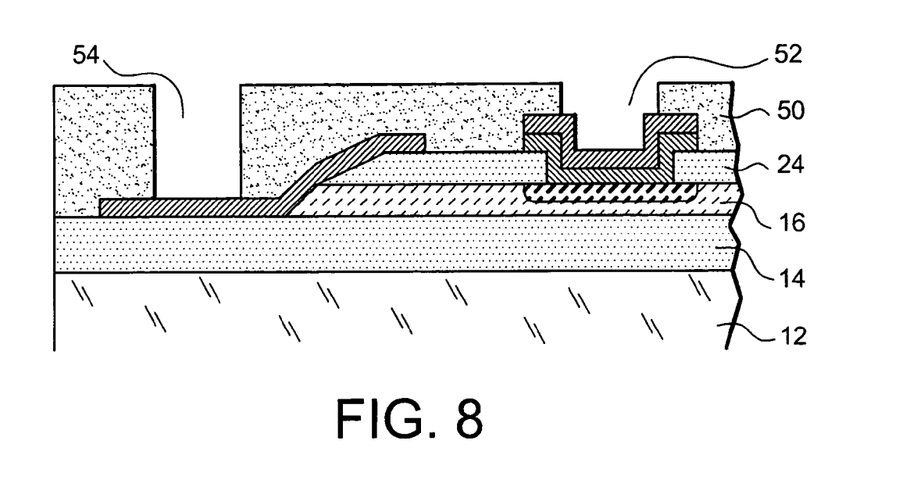
FIG. 8 is a partial diagrammatic cross-section of the device in FIG. 7 and shows a conditioning stage.

FIG. 8 shows a final stage including the passivation of the device. A passivation layer 50 of a material such as polyimide, or another insulating material is deposited on the device so as to coat the parts previously described. This layer of a thickness of the order of 2 to 20 µm can be deposited, for example, by horizontal whirler. It allows the surface of the component to be made plane. Shafts 52, 54 giving access to the anode and to the cathode can be provided in this layer so as to allow a connection to the housing by aluminium wires.

In a device in accordance with FIG. 8 the anode and cathode contact points are on the same surface, in the event the surface carrying the passivation layer 50. In the interests of convenience, this surface is designated as the "front surface". The opposite surface, formed by the thick layer 12 of silicon is designated as the "rear surface".

A description is given, in relation to the next figures, of a variant of the device with an anode contact point on the rear surface.

Figure 9:
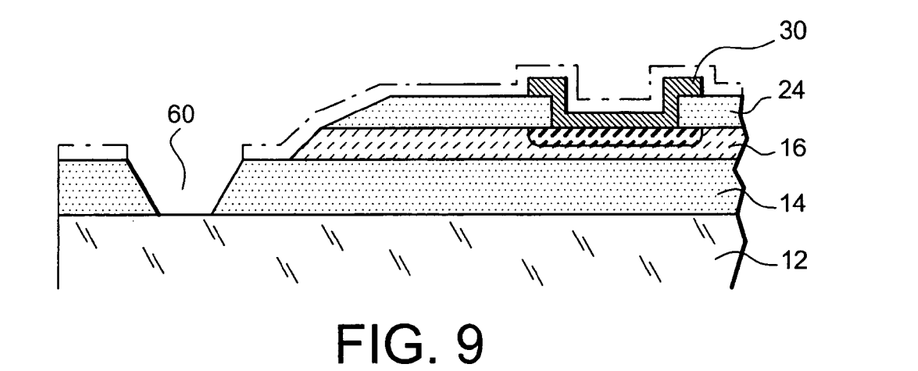
FIGS. 9 to 11 are partial diagrammatic cross-sections of the device in FIG. 4, showing stages in the manufacture of an anode in a device in accordance with the invention, according to a variant of the process shown in FIGS. 5 to 8.

FIG. 9 shows an etching stage occurring between the stages shown in FIGS. 6 and 7. During this stage an opening 60 giving access to the thick layer 12 of silicon is etched through the buried insulating layer 14. The opening obtained by wet process or plasma is localized in the part of the buried insulating layer 14 previously exposed during etching of the layer 16 of silicon carbide. The location of the opening is set by a mask shown in outline as a dot and dash line.

Figure 10:
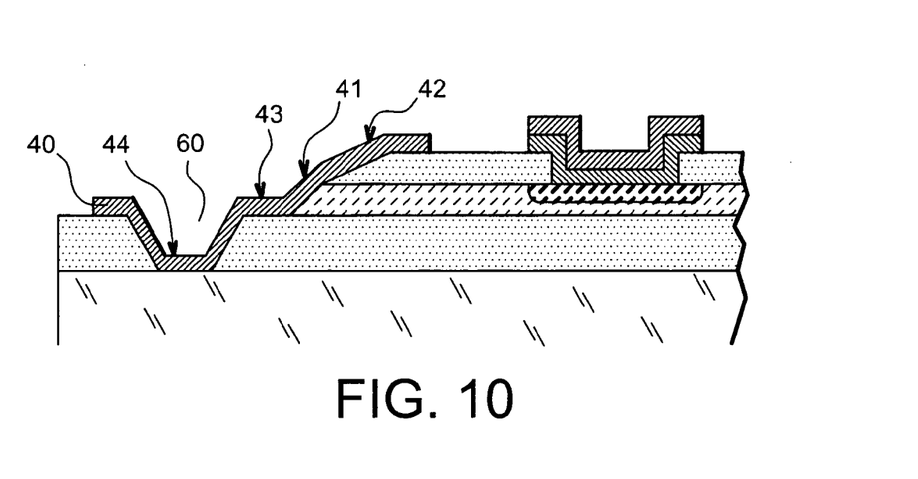

FIG. 10 shows that the junction layer 40, formed subsequently, now has a part 44 which extends into the opening 60 so as to come into ohmic contact with the layer 12 of silicon. It can be seen in FIGS. 9 and 10 that etching has also been carried out on the buried insulating layer 14 so as to obtain flanks with a gentle slope. The slope is for example between 30° and 70°. This allows good continuity of the junction layer 40.

Figure 11:
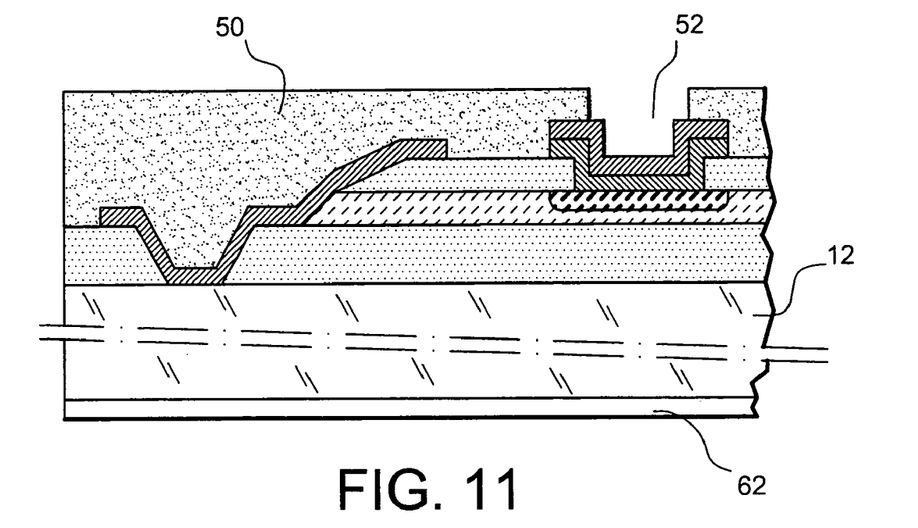

FIG. 11 shows a final stage in conditioning the component. A passivation layout 50 coats the front surface and is provided with a shaft 52 for the cathode terminal.

It will also be noticed that on the rear surface of the component there is a metallization layer 62 coating the layer 12 of silicon. This is for example a triple layer including in order a layer of Ti, of Ni then of Au. Such a structure allows an excellent contact point to be provided and facilitates the subsequent brazing of the device on the housing. The shaft 54 described with reference to FIG. 8 has become pointless. In the above manufacturing process, the first and second metal layers, and more generally the ohmic contact layers and the junction layers can be shaped so as to confer particular designs on them. This can take place during the stages illustrated in FIGS. 4, 7 and 10 particularly.

Figure 12:
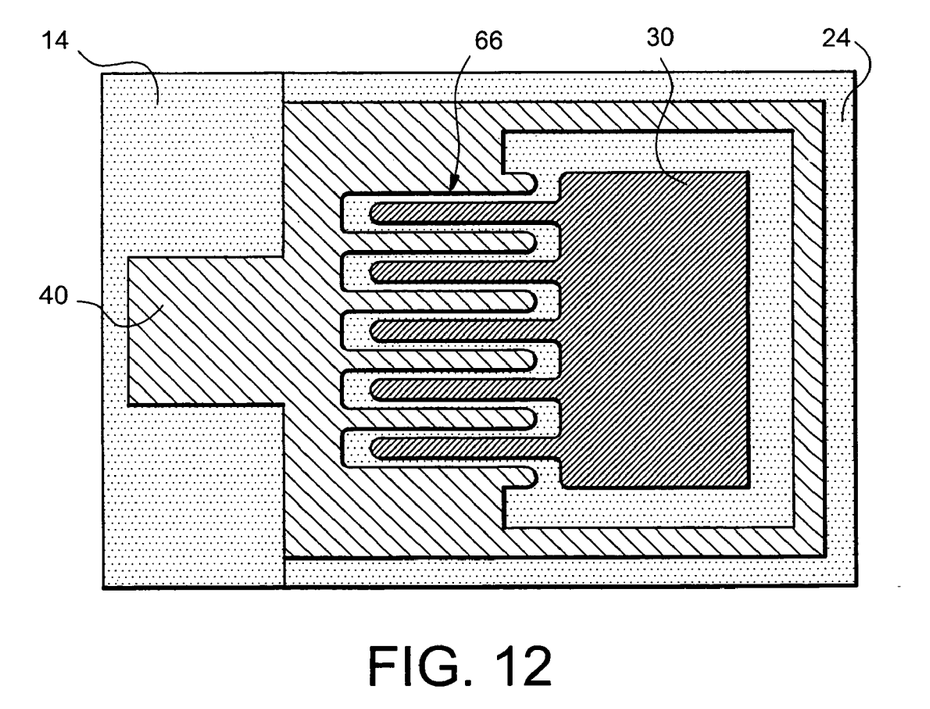
FIG. 12 is a view of a main surface of a device in accordance with the invention.

FIG. 12 shows a particular configuration of these layers. The anode forming junction layer 40 and the cathode forming metal contact layer 30 extend over an intermediate area 66 in which these layers have an interdigitated comb structure. Such a structure allows the polarisation state forward current to be increased.

Figure 13:
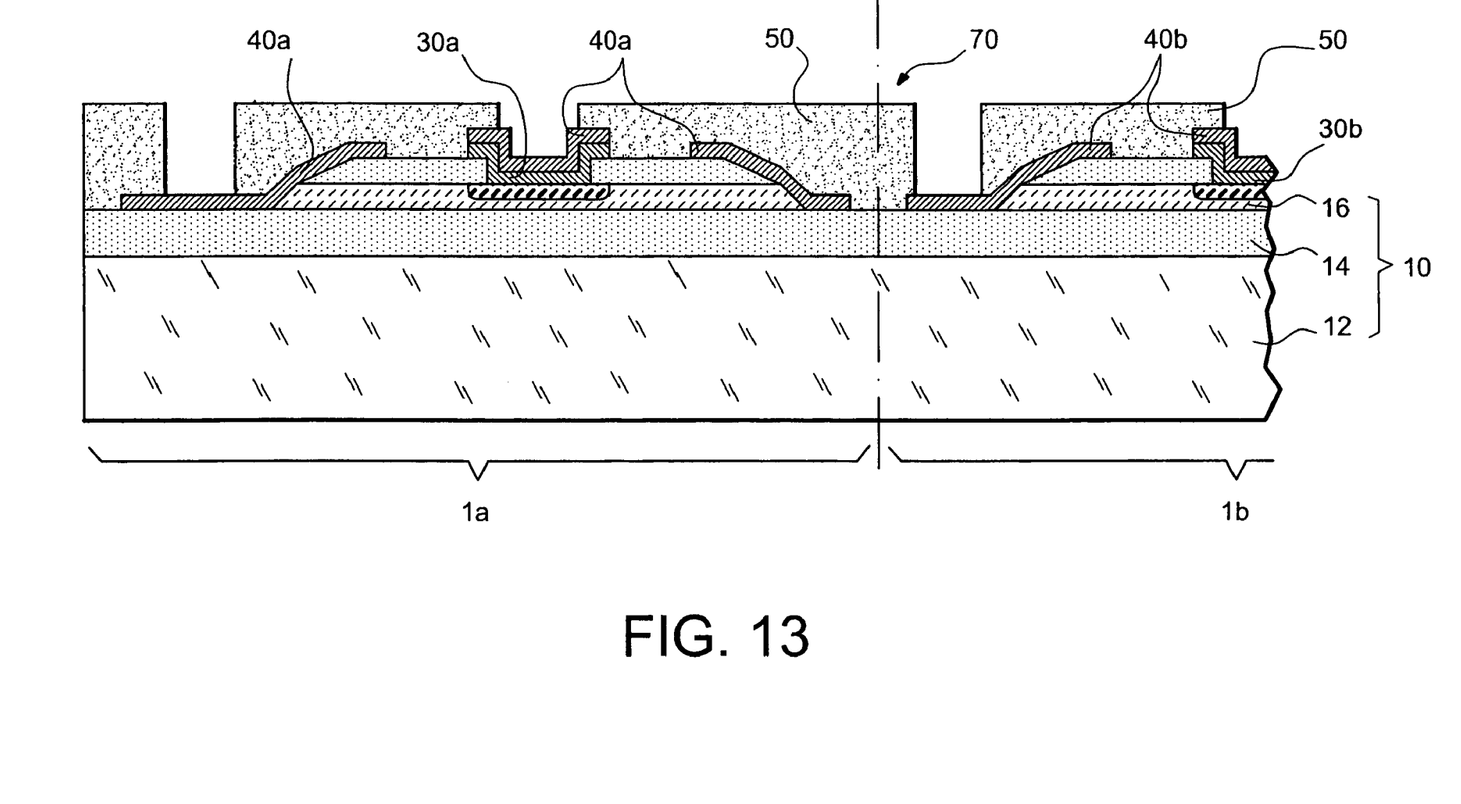
FIGS. 13 and 14 are partial diagrammatic cross-sections of a device in accordance with the invention and show different aspects of the embodiment of such a device.

The manufacture of diodes in accordance with the process indicated allows insulation between the different components to be obtained automatically. By way of illustration, FIG. 13 shows in cross-section two diodes made on the same substrate 10. A first diode, complete, is identified with the reference 1a and a second diode, only half of which is shown, is identified with the reference 1b. To distinguish the anode and cathode terminals of the two diodes, the references of the metal contact layers 30, and the junction layer 40, are followed by the letters a and b, respectively, corresponding to the diodes 1a and 1b. Reference may be made to the previous description, on the subject of these layers. In an intermediate area 70 between the two diodes the passivation layer 50 is directly in contact with the buried insulating layer 14. This results from the etching of the layer 16 of silicon carbide with barrier on the buried insulating layer 14. The area 70 thus provides perfect electrical insulation between the components. Any connection between components could be obtained during the shaping of the junction layer 40a, 40b or of the metal contact layer 30a, 30b. These layers are in fact etched respectively in a concomitant way for all the components made on the same substrate. One or more diodes can thus be connected in series or in parallel.

Figure 14:
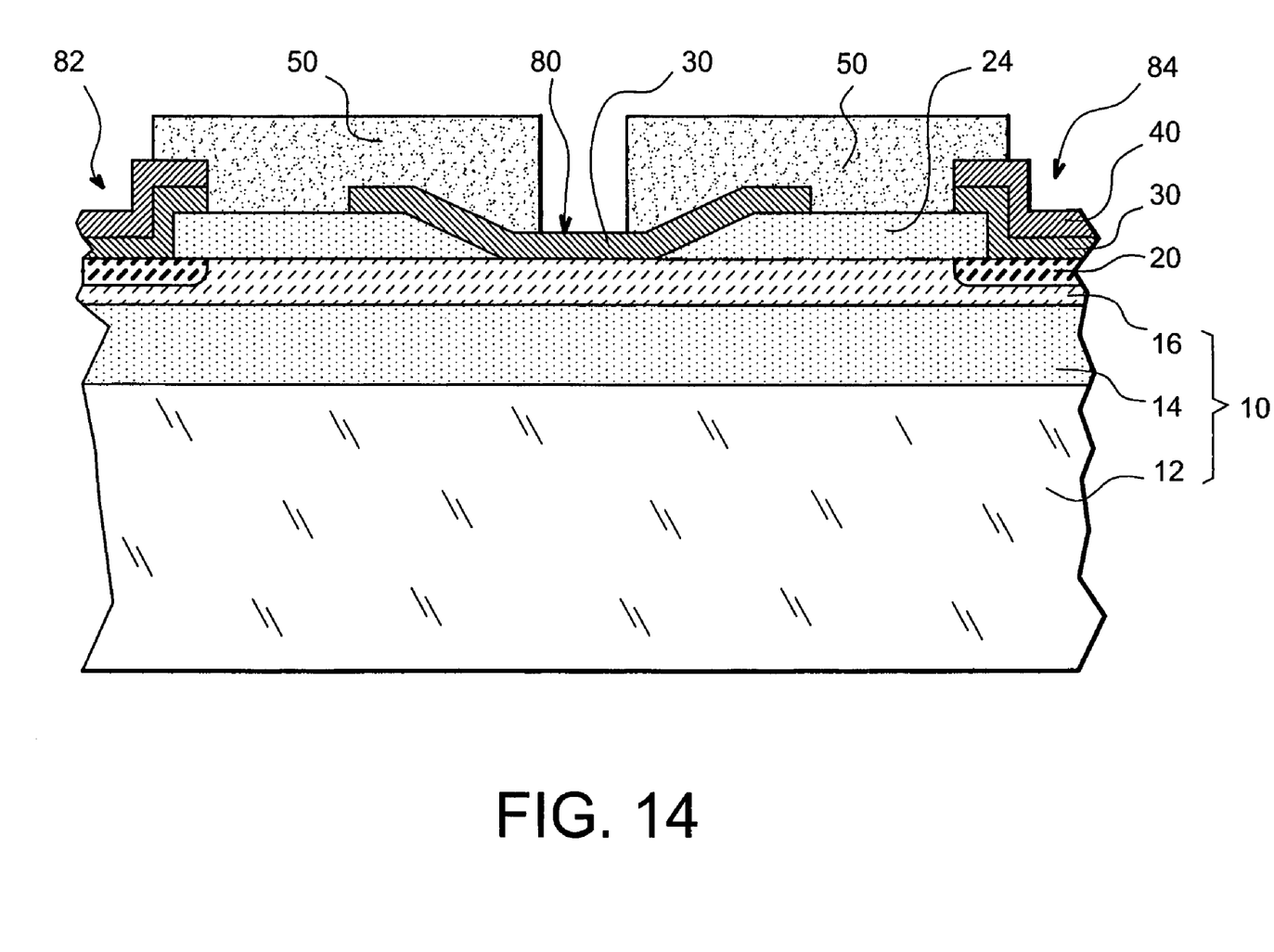

A device in accordance with the invention may comprise, apart from a diode, other components such as particularly a field effect transistor. This is shown in FIG. 14 which shows a possibility of integrating such a transistor onto the same substrate. The transistor has gate, source and drain terminals identified by the references 80, 82, 84 respectively. The manufacture of the source and drain 82, 84 is identical to that of the ohmic contact terminals of the diodes. In other words the metal contact layer 30 is in contact with doped zones 20 of the layer 16 of silicon carbide. Reference can thus also be made to the previous description. The gate 80 is obtained by making an opening in the surface of the layer of insulant 24 then by depositing therein the contact metal layer 30. The opening can be made with flared sides, particularly if the process used is the one described for Schottky diodes, in other words if it is wished to obtain both MESFET transistors and Schottky diodes. The flared sides are not however necessary for the operation of the transistors. The gate opening made in the layer 24 of insulant is achieved by etching with barrier on the layer 16 of silicon carbide. The layer portion of the contact metal layer 30 shaped to form the gate 80 thus rests on a main surface of the layer 16 of silicon carbide and not on one of its lateral flanks. The gate forms a Schottky junction. The layer 16 of silicon carbide here constitutes the transistor channel.

Documents Cited
(1) U.S. Pat. No. 6,229,179
(2) U.S. Pat. No. 6,127,703

The invention claimed is:

1. Power junction device including a substrate of the SiCOI type with a layer of silicon carbide insulated from a solid carrier by a buried layer of insulant, and including at least one Schottky contact between a first metal layer and the surface of a layer of silicon carbide, the first metal layer constituting an anode, characterized in that the first metal layer is in contact with a flank of the layer of silicon carbide, forming an angle relative to a main surface of the layer of silicon carbide wherein the angle has a value between 20° and 80°.

2. The device according to claim 1, including a surface layer of insulant coating the layer of silicon carbide, and wherein the first metal layer extends at least partially over flank of the surface layer of insulant coating the layer of silicon carbide and adjoining the flank of the surface layer of silicon carbide.

3. The device according to claim 1, including a second metal layer in ohmic contact with the layer of silicon carbide, the second metal layer forming a cathode.

4. The device according to claim 1, wherein the first metal layer extends as far as the solid carrier.

5. The device according to claim 1, including at least one power diode and at least one transistor, the transistor having a channel formed in the layer of silicon carbide.

6. The device according to claim 1, including a plurality of power diodes connected in series or in parallel.

7. The device according to claim 3, wherein the first and second metal layers have comb-forming parts respectively, the comb-forming parts of the first and second metal layers being interdigitated.

8. A process for manufacturing a power diode on a SiCOI substrate with a layer of silicon carbide insulated from a solid silicon carrier by a buried layer of insulant, the process including the following stages:
  a) the formation of an ohmic contact point on one surface of the layer of silicon carbide, opposite the buried layer of insulant,
  b) the localized etching of the layer of silicon carbide outside an area of the ohmic contact so as to release at least one lateral flank on the layer of silicon carbide, and
  c) the formation of a Schottky contact on the lateral flank.

9. The process according to claim 8, wherein the localized etching is etching using a lithographic mask and a lithographic agent with restricted selectivity relative to the lithographic mask, so as to confer a slope on the lateral flank.

10. The process according to claim 8, wherein stage a) includes the formation on the layer of silicon carbide of a surface layer of insulant.

11. The process according to claim 8, wherein the surface layer of insulant is used as a lithographic mask during stage b.

12. The process according to claim 8, wherein the Schottky contact is formed between a metal layer and the layer of silicon carbide, the metal layer being extended partly over the surface layer of insulant.

13. The process according to claim 8, wherein the Schottky contact is formed between a metal layer and the layer of silicon carbide, the metal layer being extended as far as the solid carrier, through an opening previously provided in the buried layer of insulant.

14. The process according to claim 8, wherein the stage of forming an ohmic contact point includes the formation of a doped zone in the layer of silicon carbide, then the deposition of a layer of metal in contact with a central part of the doped zone, by providing a shift between the layer of metal and the periphery of the doped zone.

* * * * *